United States Patent
Xu et al.

(10) Patent No.: US 10,090,443 B2
(45) Date of Patent: *Oct. 2, 2018

(54) LIGHT SOURCE WITH QUANTUM DOTS

(71) Applicant: KONINKLIJKE PHILIPS N.V., Eindhoven (NL)

(72) Inventors: Shu Xu, Shanghai (CN); Rifat Ata Mustafa Hikmet, Eindhoven (NL)

(73) Assignee: Koninklijke Philips N.V., Eindhoven (NL)

(*) Notice: Subject to any disclaimer, the term of this patent is extended or adjusted under 35 U.S.C. 154(b) by 36 days.

This patent is subject to a terminal disclaimer.

(21) Appl. No.: 15/392,286

(22) Filed: Dec. 28, 2016

(65) Prior Publication Data

US 2017/0110633 A1 Apr. 20, 2017

Related U.S. Application Data

(60) Continuation of application No. 15/163,271, filed on May 24, 2016, now Pat. No. 9,537,059, which is a
(Continued)

(51) Int. Cl.
*H01L 33/50* (2010.01)
*C09K 11/02* (2006.01)
(Continued)

(52) U.S. Cl.
CPC ............ *H01L 33/504* (2013.01); *C09K 11/02* (2013.01); *C09K 11/025* (2013.01);
(Continued)

(58) Field of Classification Search
CPC ....... B82Y 20/00; B82Y 40/00; C09K 11/025; C09K 11/883; H01L 2933/0041;
(Continued)

(56) References Cited

U.S. PATENT DOCUMENTS 7,600,882 B1 10/2009 Morejon
7,927,515 B2 4/2011 Jang et al.
(Continued)

FOREIGN PATENT DOCUMENTS

CN 101397137 4/2009
CN 101381600 A 11/2009
(Continued)

OTHER PUBLICATIONS

"CdSe/CdS/ZnS and CdSe/Znse/ZnS Core-Shell-Shell Nanocrystals", The Journal of Physical Chemistry B, 2004, v 108(49), pp. 18826-18831, Dimitri Talaphin et al.
(Continued)

*Primary Examiner* — Ali Alavi

(57) ABSTRACT

The invention provides a luminescent nano particles based luminescent material comprising a matrix of interconnected coated luminescent nano particles, wherein for instance wherein the luminescent nano particles comprise CdSe, wherein the luminescent nano particles comprise a coating of CdS and wherein the matrix comprises a coating comprising ZnS. The luminescent material according may have a quantum efficiency of at least 80% at 25° C., and having a quench of quantum efficiency of at maximum 20% at 100° C. compared to the quantum efficiency at 25° C.

20 Claims, 9 Drawing Sheets

Related U.S. Application Data division of application No. 14/351,898, filed as application No. PCT/IB2012/055725 on Oct. 19, 2012, now Pat. No. 9,412,916.

(60) Provisional application No. 61/549,329, filed on Oct. 20, 2011.

(51) Int. Cl.

| | | |
|---|---|---|
| *C09K 11/56* | (2006.01) | |
| *C09K 11/88* | (2006.01) | |
| *H01L 31/0232* | (2014.01) | |
| *H01L 33/00* | (2010.01) | |
| *H01L 33/04* | (2010.01) | |
| *B82Y 20/00* | (2011.01) | |
| *B82Y 40/00* | (2011.01) | |

(52) U.S. Cl.
CPC .......... *C09K 11/565* (2013.01); *C09K 11/883* (2013.01); *H01L 31/02322* (2013.01); *H01L 33/002* (2013.01); *H01L 33/04* (2013.01); *H01L 33/502* (2013.01); *H01L 33/505* (2013.01); *B82Y 20/00* (2013.01); *B82Y 40/00* (2013.01); *H01L 2933/0041* (2013.01); *Y10S 977/774* (2013.01); *Y10S 977/892* (2013.01); *Y10S 977/95* (2013.01)

(58) Field of Classification Search
CPC .............. H01L 33/504; Y10S 477/774; Y10S 477/892; Y10S 477/95
See application file for complete search history.

(56) References Cited

U.S. PATENT DOCUMENTS

| | | | |
|---|---|---|---|
| 7,972,694 B2 | 7/2011 | Sekiguchi et al. | |
| 9,412,916 B2 * | 8/2016 | Xu ..................... | C09K 11/02 |
| 9,537,059 B2 * | 1/2017 | Xu ..................... | C09K 11/02 |
| 2009/0108235 A1 | 4/2009 | Ando et al. | |
| 2009/0294742 A1 | 12/2009 | Jang et al. | |
| 2010/0163798 A1 | 7/2010 | Ryowa et al. | |
| 2011/0089453 A1 | 4/2011 | Min | |
| 2011/0124185 A1 | 5/2011 | Alivisatos et al. | |
| 2011/0227477 A1 | 9/2011 | Zhang et al. | |
| 2011/0240960 A1 | 10/2011 | Kim et al. | |
| 2014/0097742 A1 | 4/2014 | Van Bimmel et al. | |

FOREIGN PATENT DOCUMENTS

| | | |
|---|---|---|
| JP | 2010-155872 A | 7/2010 |
| RU | 2346022 C2 | 2/2009 |
| WO | WO-2007086188 A1 | 8/2007 |
| WO | WO-2009108235 A2 | 9/2009 |
| WO | WO-2012035109 | 3/2012 |

OTHER PUBLICATIONS

"Excitonic Emission of Colloidal Nano-Crystals Embedded in Molecular . . . ", Rashad, et al, Journal of Physics, vol. 245, No. 1, Sep. 20, 2010, p. 12006.

Multiexciton Fluorescence From Semiconductor Nanocrystals, Fisher, et al., Chem. Physics, vol. 318, No. 1-2, Nov. 15, 2005, p. 71-81.

CN 201280051700.2, Second Office Action, dated May 15, 2015, pp. 1-8.

CN201280051700.2, First Office Action, dated Dec. 10, 2014, pp. 1-12.

EPO as International Search Report and Written Opinion dated Feb. 14, 2013 from International Application No. PCT/IB2012/055725, filed Oct. 19, 2012, 12 pages.

JP 2014-536393, Office Action dated Jan. 16, 2015, pp. 1-4.

KR 10-2014-7010671, Preliminary Rejection, dated Jul. 14, 2014, pp. 1-7.

U.S. Notice of Allowance, U.S. Appl. No. 14/351,898, dated Jun. 22, 2016, 11 pps.

Official Action dated Sep. 29, 2016, Russian Patent Application No. 2014110509, 8 pages.

Decision on Grant dated Jan. 11, 2017, Russian Patent Application No. 2014110509, 16 pages.

* cited by examiner

LIGHT SOURCE WITH QUANTUM DOTS

CROSS-REFERENCE TO RELATED APPLICATIONS

The present application is a continuation of U.S. patent application Ser. No. 15/163,271, filed on May 24, 2016, titled "LIGHT SOURCE WITH QUANTUM DOTS", which is a divisional of U.S. patent application Ser. No. 14/351,898 filed on Apr. 15, 2014, titled "LIGHT SOURCE WITH QUANTUM DOTS", issued as U.S. Pat. No. 9,412,916 on Aug. 9, 2016, which is a § 371 application of International Application No. PCT/IB2012/055725 filed on Oct. 19, 2012, which claims priority to U.S. Provisional Patent Application No. 61/549,329, filed Oct. 20, 2011. U.S. patent application Ser. No. 15/163,271, U.S. patent application Ser. No. 14/351,898, International Application No. PCT/IB2012/055725, and U.S. Provisional Patent Application No. 61/549,329 are incorporated herein.

FIELD OF THE INVENTION

The invention relates to a luminescent nano particles based luminescent material, a method for producing such luminescent nano particle based luminescent material, as well as to a lighting unit comprising a light source and such luminescent nano particles based luminescent material for light conversion of light source light.

BACKGROUND OF THE INVENTION

The use of quantum dots (QD) for lighting applications is known in the art. US20110240960, for instance, describes a light emitting device comprising a light emitting source, a first quantum dot wavelength converter disposed above the light emitting source, the first quantum dot wavelength converter comprising, a plurality of first quantum dots for generating wavelength-converted light by converting wavelength of light from the light emitting source, a first dispersive medium embedding the first quantum dots dispersively therein, and a first sealer for sealing the entire outside surface of dispersive medium embedding the first quantum dots in a pack. A first encapsulant is applied for encapsulating the entire outside surface of the first quantum dot wavelength converter. Further, a second quantum dot wavelength converter is disposed above the first quantum dot wavelength converter, the second quantum dot wavelength converter comprising a plurality of second quantum dots for generating wavelength-converted light by converting wavelength of light from the light emitting source, a second dispersive medium embedding the second quantum dots dispersively therein, and a second sealer for sealing the entire outside surface of the second dispersive medium embedding the second quantum dots in a pack, wherein the first quantum dot wavelength converter, the second quantum dot wavelength converter and the light emitting source are spaced apart from each other. The second encapsulant is disposed on the entire outside surface of the second quantum dot wavelength converter and for encapsulating the entire outside surface of the second quantum dot wavelength converter. Further, the light emitting source is a light emitting diode or a laser diode.

SUMMARY OF THE INVENTION

Nano sized semiconductor nanoparticles, including quantum dots (QDs) as a major branch, have shown high potential as phosphor materials for lighting applications such as light conversion in LEDs and solar cells. When used in white light LEDs, they can be combined with blue light emitting solid state light sources for converting blue light to other colors. Compare to dyes and doped inorganic phosphors such as YAG, QDs have the advantage to be produced with narrow emission band and tunable emission wavelength by the size of the QDs. Hence they can offer much pure hybrid white light and desired light temperature. One major problem in the application of the quantum dots is the relative low quantum efficiency, thermal quenching and stability of the unprotected quantum dots.

Quantum dots have theoretical high quantum efficiency and stability in light conversion and energy transfer, however, pure particles are suffered from their high sensitivity to surface environments and usually exhibit low quantum yields and both concentration quenching and thermal quenching. In order to obtain high quantum efficiency semiconductor quantum dots and avoid the concentration and temperature quenching, a common approach is to grow additional shells on the quantum dots. The shell materials with unique properties are adopted for different functions. In many cases, the shell also has to be directed growing into certain thickness and shape for the best performance while keeping minimum lattice mismatch. For these purposes, multi shelling are preferred. However, due to the lattice mismatch and built in stresses between different core and shells materials, it appears to be a rather difficult synthesis to make all the functions work. For an example of CdSe quantum dots, it is desired to be able to grow thick shells of semiconductor materials (CdS and ZnS) on the core CdSe quantum dots. Here the CdS as a absorption buffer layer, which strongly improves the light absorbance of the nanoparticle and reduced the concentration quenching. It may require a large ratio of the volume of shell CdS to volume of core CdSe to fulfill the function and in most cases a rod or multi-pods shape of CdS to maintain minimum lattice mismatch for the size. Meanwhile the ZnS, which is used for surface passivation for high quantum efficiency and stability, are more stable when growing on a spherical surface.

According to the above reasons, it is almost impossible to achieve all the properties with the multi shelling in simple spherical or rod shape structure, in which the stress builds up and quantum yield goes down. or solving this problem and obtain stable multi functional shelling, new core-multi shells structure and synthesis methods are needed.

Hence, it is an aspect of the invention to provide an alternative luminescent nano particles based luminescent material, which preferably further at least partly obviate one or more of above-described drawbacks. It is also an aspect of the invention to provide a method for the production of such luminescent nano particles based luminescent material. Further, it is an aspect of the invention to provide an alternative lighting unit with such luminescent nano particles based luminescent material, which preferably further at least partly obviate one or more of above-described drawbacks.

Hence, in a first aspect, the invention provides a luminescent nano particles based luminescent material ("luminescent material") comprising a matrix (herein sometimes also indicated as "composite") (wherein the matrix is coated (below indicated as second coating)) of interconnected coated luminescent nano particles, wherein the luminescent nano particles (herein further also indicated as "quantum dots") are selected from the group consisting of semiconductor nano particles that are able to emit in the visible part of the spectrum, wherein the luminescent nano particles comprise a first coating comprising a first coating material, being different from the semiconductor material of the nano particles, wherein the first coating material is selected from the group consisting of $M1_x\text{-}M2_y\text{-}M3_z\text{-}A_{(x+2y+3z)/2}$ compounds, wherein M1 is selected from the group consisting of Na, Li, Mg, Cu, Ag and Au, especially Cu, Ag and Au, wherein M2 is selected from the group consisting of Zn and Cd, wherein M3 is selected from the group consisting of Ga, As, In and Tl, especially Ga, In and Tl, and wherein A is selected from the group consisting of O, S, Se, As, P, and Te, especially S, Se, and Te, wherein x is in the range of 0-1, wherein y is in the range of 0-1, wherein z is in the range of 0-1, and wherein at least one of x, y and z is larger than 0, wherein the matrix comprises a second coating comprising a second coating material, being different from the first coating material, wherein the second coating material is selected from the group consisting of M4A and SiO2, wherein M4 is selected from the group consisting of Al, Ca, Mg, Zn and Cd, especially Ca, Mg, Zn and Cd, and wherein A is selected from the group consisting of Cl, F, O, S, Se and Te, especially S, Se and Te.

Surprisingly, this luminescent material may be relative efficient (high quantum yield) and may have a relative low temperature quenching. The thermal quenching may be substantially lower than for the basic luminescent nano particles material. It appears that also the QY may be higher than for the luminescent nano particles based luminescent material per se or higher than for the coated luminescent nano particles based luminescent material. Hence, the coated matrix provides unexpected advantageous properties to the luminescent nano particles. The luminescent nano particles based luminescent material can be seen as a matrix, with a coating, wherein the matrix hosts a plurality of luminescent nano particles. The nano particles are substantially not in physical contact with each other. More precisely, even the coated nano luminescent nano particles are substantially not in physical contact with each other, as they are embedded in a larger matrix, wherein the matrix is (further) built up of first coating material and especially the second coating material.

The luminescent nano particles based luminescent material can be described as an agglomerate of interconnected luminescent nano particles. Those nano particles are coated. Hence, the luminescent nano particles based luminescent material can also be described as agglomerate of interconnected coated luminescent nano particles. Though the term agglomeration might be used, a specific element of the invention may be the presence of spherical-joint structures of coated nano particles in a big volume of matrix Simple agglomeration of luminescent nanoparticles is usually not welcome for quantum dots because it causes the energy lose. However, in the invention it may not be simple agglomerate of the coated nano particles. The nano particles, are growing into the matrix; i.e. the coating on the luminescent nano particles forms together with the second coating a matrix. The second coating may thus be seen as part of the matrix that constitutes the matrix as well as a coating on the matrix.

During the reaction, the second coating grows onto the surface of coated nano particles (such as CdSe/CdS), accompanied with the surface reconstruction (of the first coating material). When the second coating material such as ZnS keeps growing, nearby of coated nano particles (such as CdSe/CdS and CdSe/CdS/ZnS) are cross-linked to form a coated matrix where the of coated nano particles (such as CdSe/CdS) are embedded in. In this way, the (coated) luminescent nano particles are interconnected. Or, in other words, it is not a pure agglomeration, but an interconnected system of coated luminescent nano particles, herein also indicated as matrix.

The luminescent material may in principle be any luminescent material that can be provided as nano particles. However, especially, the luminescent nano particles based luminescent material is preferably a semi conductor type of luminescent material. The quantum dot may include one of a Si-based nano crystal, a group II-VI compound semiconductor nano crystal, a group III-V compound semiconductor nano crystal, a group IV-VI compound nano crystal and a mixture thereof.

The luminescent nano particles may for instance comprise group II-VI compound semiconductor quantum dots selected from the group consisting of CdS, CdSe, CdTe, ZnS, ZnSe, ZnTe, HgS, HgSe, HgTe, CdSeS, CdSeTe, CdSTe, ZnSeS, ZnSeTe, ZnSTe, HgSeS, HgSeTe, HgSTe, CdZnS, CdZnSe, CdZnTe, CdHgS, CdHgSe, CdHgTe, HgZnS, HgZnSe, HggZnTe, CdZnSeS, CdZnSeTe, CdZnSTe, CdHgSeS, CdHgSeTe, CdHgSTe, HgZnSeS, HgZnSeTe and HgZnSTe.

In another embodiment, the luminescent nano particles may for instance be group III-V compound semiconductor quantum dots selected from the group consisting of GaN, GaP, GaAs, MN, AlP, AlAs, InN, InP, InAs, GaNP, GaNAs, GaPAs, AlNP, AlNAs, AlPAs, InNP, InNAs, InPAs, GaAlNP, GaAlNAs, GaAlPAs, GaInNP, GaInNAs, GaInPAs, InAlNP, InAlNAs, and InAlPAs.

In yet a further embodiment, the luminescent nano particles may for instance be I-III-VI2 chalcopyrite-type semiconductor quantum dots selected from the group consisting of $CuInS_2$, $CuInSe_2$, $CuGaS_2$, $CuGaSe_2$, $AgInS_2$, $AgInSe_2$, $AgGaS_2$, and $AgGaSe_2$.

In yet a further embodiment, the luminescent nano particles may for instance be I-V-VI2 semiconductor quantum dots, such as selected from the group consisting of $LiAsSe_2$, $NaAsSe_2$ and $KAsSe_2$.

In yet a further embodiment, the luminescent nano particles may for instance be group IV-VI compound semiconductor nano crystals such as SbTe. In a specific embodiment, the luminescent nano particles are selected from the group consisting of InP, $CuInS_2$, $CuInSe_2$, CdTe, CdSe, CdSeTe, $AgInS_2$ and $AgInSe_2$.

In yet a further embodiment, the luminescent nano particles may for instance be one of the group II-VI, III-V, I-III-V and IV-VI compound semiconductor nano crystals selected from the materials described above with inside dopants such as ZnSe:Mn, ZnS:Mn. The dopant elements could be selected from Mn, Ag, Zn, Eu, S, P, Cu, Ce, Tb, Au, Pb, Tb, Sb, Sn and Tl.

Herein, the luminescent nano particles based luminescent material may also comprise different types of QDs, such as CdSe and ZnSe:Mn.

The luminescent nano particles (without coating) may have dimensions in the range of about 2-10 nm For instance, spherical particles such as CdSe, InP, $CuInSe_2$ with a diameter of about 3 nm may be provided.

The luminescent nano particles (without coating) may have the shape of spherical, cube, rods, wires, disk, multipods, etc., with the size in one dimension of less than 10 nm For instance, nanorods of PbSe with the length of 20 nm and a diameter of 4 nm may be provided.

The luminescent nano particles or quantum dots are provided with a coating, indicated herein with the term "first coating". The first coating comprises a material that is different from the QD material. Different may be different in chemical composition; preferably however the first coating material has the same crystal structure as the quantum dot. As indicated above, the first coating material is especially selected from the group consisting of $M1_x\text{-}M2_y\text{-}M3_z\text{-}A_{(x+2y+3z)/2}$ compounds, wherein M1 is selected from the group consisting of Cu, Ag and Au, wherein M2 is selected from the group consisting of Zn and Cd, wherein M3 is selected from the group consisting of Ga, In and Tl, and wherein A is selected from the group consisting of S, Se and Te, wherein x is in the range of 0-1, wherein y is in the range of 0-1, wherein z is in the range of 0-1, and wherein at least one of x, y and z is larger than 0. In a specific embodiment, the first coating comprises a material selected from the group consisting of $Cu_xZn_yIn_zS_{(x+2y+3z)/2}$ $Cu_xZn_yIn_zSe_{(x+2y+3z)/2}$ ZnTeSe, and CdS. Examples of $M1_x\text{-}M2_y\text{-}M3_z\text{-}A_{(x+2y+3z)/2}$ are for instance $CuZnInS_3$, $AgZnInSe_3$, $CuCdInSe_3$, etc. In an embodiment, the first coating comprises a plurality of coatings (i.e. a plurality of coating layers on top of each other). In this way, the coated luminescent material may comprise multi-shell particles. In yet another embodiment, which may be combined with the former (variants), the coating material of the first coating comprises a plurality of different coating materials.

The coated luminescent nano particles may have different shapes and may be of different types. In an embodiment, the matrix comprises dots-in-rots nano particles, such as CdSe/CdS dots-in-rots nano particles. For instance, a rod-shaped CdS particle may enclose a (spherical) CdSe particle. In another embodiment, the matrix comprises core-shell nano particles, such as CdSe/CdS core-shell nano particles. As will be clear to a person skilled in the art, the luminescent nano particles based luminescent material may comprise different types of coated luminescent nano particles, in an embodiment differing in first coating materials, in another embodiment differing in luminescent nano particles, in another embodiment differing morphologies. For instance, in an embodiment, the matrix may comprise CdSe/CdS dots-in-rots nano particles and ZnTeSe/ZnS, $CuInS_2$/ZnSeS, InP/ZnS core-shell nano particles.

The nano particles are used as building blocks of the matrix, be it spherical type of nano particles or rod-shaped nano particles. All nano particles may contain luminescent cores (and are thereby QDs), but in an embodiment part of the nano particles have no luminescent cores. In an embodiment, 1-100% of the nano particles in the matrix comprise a luminescent core, such as one of the above indicated semi conductors, such as 1-50%, like 2-25%, although higher than 50% may also be an option. By varying this percentage, the distance between adjacent QDs may be tuned.

As indicated above, the luminescent nano particles may be interconnected. For instance, quantum dots (in rods) may be connected by the connected to each other when the second coating is applied. Further, quantum dots may be connected by joints formed by second coating material, such as ZnS joints. Therefore, in an embodiment, the matrix of interconnected luminescent nano particles may comprise spherical-joint structures, wherein one or more spherical parts comprise one or more coated luminescent nano particles, wherein the spherical parts are interconnected with joints comprising a material selected form the group consisting of $M1_x\text{-}M2_y\text{-}M3_z\text{-}A_{(x+2y+3z)/2}$, M4A (such as ZnS or CdS) and $SiO_2$ compounds, with M1, M2, M3, M4, A, x, y, z as defined above. Especially, the second coating material is selected from the group consisting of $SiO_2$, MgS, $Zn_{1-x}Mg_xS_ySe_{1-y}$ (with x being in the range of 0-1 and y being in the range of 0-1), ZnO, $TiO_2$, ZnS and ZnSe. In another embodiment, the second coating material comprises ZnSO3 and/or ZnSO4. In yet another embodiment, ZnSSe is applied as second coating material. Especially, the second coating may be sulfide or selenide based, even more especially the second coating material comprises $Zn_{1-x}Mg_x$-$S_ySe_{1-y}$ (such as ZnS and/or ZnSe and/or MgS). The second coating material may further improve the quantum yield and thermal stability.

In a specific embodiment, the luminescent nano particles comprise CdSe, the first coating material comprises CdS and the second coating material comprises ZnS.

The matrix may further be advantageous for keeping the nano particles at some distance of each other, which may reduce reabsorption (losses). Hence, in an embodiment, adjacent luminescent nano particles (within the same matrix) may have a shortest distance of at least 5 nm, such as at least 20 nm, like in the range of 5-200 nm, like 10-100 nm, such as 2-80 nm. The distance can be tuned by choosing the volume ratio of coated nano particles and second coating and/or by including nano particles without a luminescent core (i.e. nano particles essentially consisting of first coating material).

The second coating may for instance have a coating thickness (d2) in the range of 1-50 nm, like at least 2 nm. The thickness of the second coating may vary. Further, there may be parts in the matrix, such as the joints, essentially consisting of only the second coating material. In an embodiment, the second coating comprises a plurality of coatings (i.e. a plurality of coating layers on top of each other). In yet another embodiment, which may be combined with the former (variants), the coating material of the second coating comprises a plurality of different coating materials.

The luminescent material, as indicated above, may have advantageous properties. In an embodiment, the luminescent material has a quantum efficiency of at least 80% at 25° C. Further, it may have a quench of quantum efficiency (or quantum yield) of at maximum 20%, such as at maximum 12% at 100° C. compared to the quantum efficiency at 25° C. Further, it appears that advantageously the absorption in the blue may increase due to the first and/or second coating material. This may lead to an increase of absorption and thus increases light yield. In an embodiment, the luminescent material may have absorption at 400-500 nm, especial at 450 nm of at least 10 times higher than the first absorption peak according to the direct band gap of the core quantum dots, such as the CdSe core.

The nano particles or quantum dots may for instance be indicated as component A; the coating on the nano particles may be indicated as component B and the matrix coating may be indicated as component C. Component A is the core material (for example CdSe), which may present the main property for application, such as emission wavelength and emission band. Component A could be single quantum dots or hybrids. Component B is the shell material (for example CdS), which may (optionally together with component C) form the main body and shape of the matrix. It may also have the function to enhance the property of the component A or bring new property for the whole matrix. It may grow substantially lattice matched on component A (preferably <10%, especially <5% lattice mismatch). Component C is the shell material (for example ZnS), which may cover component B to give additional enhancement or function of the matrix. It grows lattice matched on component B (preferably <10%, especially <5% lattice mismatch). The materials used for component A (for example CdSe) may have the property of theoretical high quantum efficiency. The materials used for component B (for example CdS), may have the property of theoretical much stronger light absorption to certain wavelength, such as in the UB and/or blue, than component A. The materials used for component C (for example ZnS), may have the property of high stability in open environments than component A and B. The matrix body formed by component B (for example CdS), and optionally component C, contains two or more regions. Main regions have surface facets matching to the component C (for example ZnS, <5% lattice mismatch) to provide the stable growth of component C. The other regions may function as (crosslink) joints, which may have higher lattice mismatch with component C, however, the lattice stress between component B and C at these regions are reduced by surroundings. The nano-structural core/multi-shell semiconductor matrices may have high quantum yields (>70%) and narrow emission band (FWHM<50 nm). The nano-structural core/multi-shell semiconductor matrices may have at least 5 times more absorbance at the blue region than at the first absorption peak of the emmisive cores. The nano-structural core/multi-shell semiconductor matrices may have the reduced thermal quenching. The quantum yields at 100° C. may show a drop not more than 20% with respect to room temperature QY. In the matrices explained above, the total volume ratio of component B to component A may be larger than or equal to 4. Hence, the volume occupied by the first coating material may be at least 4 times larger than the volume occupied by the luminescent nano particles. The nano-structural core/multi-shell semiconductor matrices described here may contain three or more components, show here as component A, component B and component C. However, more components embodied in the structure using the same way are available. These structures can be embedded in organic and/or inorganic matrices.

In yet a further aspect, the invention also provides a method for producing a luminescent nano particle based luminescent material (such as described above), the method comprising:

mixing coated luminescent nano particles, a second coating precursor system, and optionally a surfactant in a liquid; and heating the thus obtained mixture, wherein wherein the luminescent nano particles are selected from the group consisting of semiconductor nano particles that are able to emit in the visible part of the spectrum, wherein the coated luminescent nano particles comprise a first coating comprising a first coating material, being different from the semiconductor material of the nano particles, wherein the first coating material is selected from the group consisting of $M1_x$-$M2_y$-$M3_z$-$A_{(x+2y+3z)/2}$ compounds, wherein M1 is selected from the group consisting of Na, Li, Mg, Cu, Ag and Au, wherein M2 is selected from the group consisting of Zn and Cd, wherein M3 is selected from the group consisting of Ga, As, In and Tl, and wherein A is selected from the group consisting of O, S, Se, As, P, and Te, wherein x is in the range of 0-1, wherein y is in the range of 0-1, wherein z is in the range of 0-1, and wherein at least one of x, y and z is larger than 0, and wherein the second coating precursor system comprises one or more precursors for forming a second coating on the coated luminescent nano particles, the second coating comprising a second coating material, being different from the first coating material, wherein the second coating material is selected from the group consisting of M4A and $SiO_2$, wherein M4 is selected from the group consisting of Al, Ca, Mg, Zn and Cd, and wherein A is selected from the group consisting of Cl, F, O, S, Se and Te.

The precursor system may comprise one or more compounds that may form, on the surface of the coated nano particle the second coating. Hereby, the matrix with a plurality of nano particles is built up, and the coated matrix may be provided. The surfactant may for instance be myristic acid. However, also one or more of fatty acids such as stearic acid, hexylphosphonic acid, fatty amines such as hexydecylamine, fatty thiols such as 1,2-di-O-hexyldecyl-rac-glycerol, Trioctylphosphine and trioctylphoshine oxide may be applied.

The second coating precursor system comprises one or more of Bis[bis(2-hydroxyethyl) dithio carbamato]zinc(II), 2-Mercaptopyridine N-Oxide Zinc Salt, (Toluene-3,4-dithiolato)zinc(II), Dibenzyl dithio carbamic Acid Zinc(II) Salt, Zinc(II) Dibutyl dithio carbamate, Diethyl dithio carbamic Acid Zinc Salt, Zinc Dimethyl dithio carbamate, Bis(tetrabutylammonium) Bis(1,3-dithiole-2-thione-4,5-dithiolato) zinc Complex. However, also other carbamic acid zinc salts or chemicals with similar structure may be provided. Further, instead of or in addition to Zn also other type of organo-metal compounds may be provided like magnesium or cadmium equivalents. Further, instead of or in addition to sulfides, also selenides or tellurides may be applied. Especially, the second coating material comprises ZnS, and thus the second coating precursor system may be as indicated above (such as zinc dibenzyldithiocarbamate).

The heating may be a heating to a temperature in the range of about 300° C. or less. Especially, heating is to a temperature of 270° C. or less, but preferably at least above about 140° C., such as at least about 150° C. In a specific embodiment, the heating is a two-step heating, comprising a heating to a temperature in the range of 140-210° C., keeping the temperature for at least 5 minutes at this temperature, and then a further heating to a temperature in the range of larger than 170° C. and equal to or lower than 300° C., especially at maximum 270° C., such as in the range of 180-260° C.

Further, the method may comprise separating the thus obtained luminescent material from the liquid and drying the luminescent material.

In yet a further aspect, the invention provides a lighting unit comprising a light source configured to provide light source light in the UV or blue part of the visible spectrum and the luminescent material as defined above, configured to absorb at least part of the light source light. In a specific embodiment, the luminescent material is comprised in a coating, and wherein the coating is configured to transmit at least part of the light source light, and wherein the light source comprises a LED. In a further embodiment, the luminescent material is remote from the light source, i.e. at a non-zero distance. For instance, the luminescent material may be applied to or may be comprised by a window of the lighting unit. In case the light source is configured to provide blue light, the luminescent material may be configured to convert only part of the light source light. The blue light of the light source and the luminescent material light of the luminescent nano particles based luminescent material together may in an embodiment provide white lighting unit light.

The term white light herein, is known to the person skilled in the art. It especially relates to light having a correlated colour temperature (CCT) between about 2000 and 20000 K, especially 2700-20000 K, for general lighting especially in the range of about 2700 K and 6500 K, and for back-lighting purposes especially in the range of about 7000 K and 20000 K, and especially within about 15 SDCM (standard deviation of colour matching) from the BBL (black body locus), especially within about 10 SDCM from the BBL, even more especially within about 5 SDCM from the BBL.

The terms "violet light" or "violet emission" especially relates to light having a wavelength in the range of about 380-440 nm. The terms "blue light" or "blue emission" especially relates to light having a wavelength in the range of about 440-490 nm (including some violet and cyan hues). The terms "green light" or "green emission" especially relate to light having a wavelength in the range of about 490-560 nm. The terms "yellow light" or "yellow emission" especially relate to light having a wavelength in the range of about 560-590 nm. The terms "orange light" or "orange emission" especially relate to light having a wavelength in the range of about 590-620. The terms "red light" or "red emission" especially relate to light having a wavelength in the range of about 620-750 nm. The terms "visible" light or "visible emission" refer to light having a wavelength in the range of about 380-750 nm.

The terms "upstream" and "downstream" relate to an arrangement of items or features relative to the propagation of the light from a light generating means (here the especially the first light source), wherein relative to a first position within a beam of light from the light generating means, a second position in the beam of light closer to the light generating means is "upstream", and a third position within the beam of light further away from the light generating means is "downstream".

The term "substantially" herein, such as in "substantially all emission" or in "substantially consists", will be understood by the person skilled in the art. The term "substantially" may also include embodiments with "entirely", "completely", "all", etc. Hence, in embodiments the adjective substantially may also be removed. Where applicable, the term "substantially" may also relate to 90% or higher, such as 95% or higher, especially 99% or higher, even more especially 99.5% or higher, including 100%. The term "comprise" includes also embodiments wherein the term "comprises" means "consists of".

Furthermore, the terms first, second, third and the like in the description and in the claims, are used for distinguishing between similar elements and not necessarily for describing a sequential or chronological order. It is to be understood that the terms so used are interchangeable under appropriate circumstances and that the embodiments of the invention described herein are capable of operation in other sequences than described or illustrated herein.

The devices herein are amongst others described during operation. As will be clear to the person skilled in the art, the invention is not limited to methods of operation or devices in operation.

It should be noted that the above-mentioned embodiments illustrate rather than limit the invention, and that those skilled in the art will be able to design many alternative embodiments without departing from the scope of the appended claims. In the claims, any reference signs placed between parentheses shall not be construed as limiting the claim. Use of the verb "to comprise" and its conjugations does not exclude the presence of elements or steps other than those stated in a claim. The article "a" or "an" preceding an element does not exclude the presence of a plurality of such elements. The mere fact that certain measures are recited in mutually different dependent claims does not indicate that a combination of these measures cannot be used to advantage.

The invention further applies to a device comprising one or more of the characterizing features described in the description and/or shown in the attached drawings. The invention further pertains to a method or process comprising one or more of the characterising features described in the description and/or shown in the attached drawings.

The various aspects discussed in this patent can be combined in order to provide additional advantages. Furthermore, some of the features can form the basis for one or more divisional applications.

BRIEF DESCRIPTION OF THE DRAWINGS

Embodiments of the invention will now be described, by way of example only, with reference to the accompanying schematic drawings in which corresponding reference symbols indicate corresponding parts, and in which.

DETAILED DESCRIPTION OF THE EMBODIMENTS

Figure 1A:
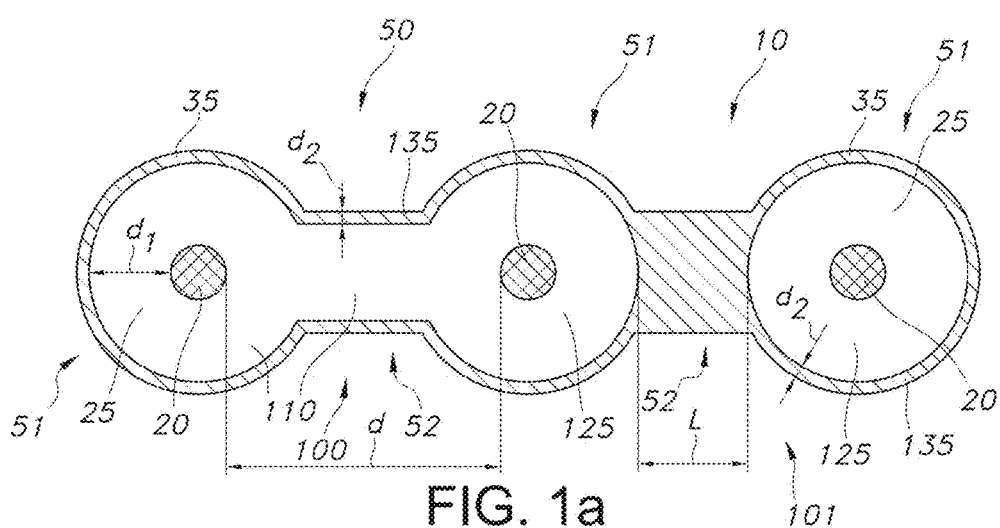
FIGS. 1a-1d schematically depict some embodiment of the luminescent material.

FIG. 1a schematically depicts a luminescent nano particles based luminescent material 100 comprising a coated matrix 10 of interconnected coated luminescent nano particles 20. The luminescent nano particles 20, such as CdSe QDs, are selected from the group consisting of semiconductor nano particles that are able to emit in the visible part of the spectrum. The luminescent nano particles 20 comprise a first coating 25 comprising a first coating material 125, such as CdS, being different from the semiconductor material of the nano particles. The matrix 10 comprises a second coating 35 comprising a second coating material 135, being different from the first coating material 125. Therefore, the term "coated matrix 10" is herein applied. The table below gives a non limiting number of examples of combination of materials that can be used to make the coated matrix 10:

| | Specific combination | Alternative combination |
|---|---|---|
| Core | CdSe | InP, $CuInS_2$, $CuInSe_2$, CdTe, CdSeTe, $AgInS_2$, $AgInSe_2$, ZnSe:Mn |
| Shell | CdS | $Cu_xZn_yInzS_{(x+2y+3z)/2}$, $Cu_xZn_yInzSe_{(x+2y+3z)/2}$, ZnSeTe |
| Coating | ZnS | $SiO_2$, MgS, ZnSe, ZnO, $TiO_2$, $Zn_{1-x}Mg_xS_ySe_{1-y}$, ZnSOx |

FIG. 1a shows a particle 101 of such luminescent nano particles based luminescent material 100. The matrix 10 comprises matrix material 110, which comprises the coated nano particles 20, i.e. the nano particles 20 with first coating 25, and the second coating material 35. Note that some parts of the matrix 10 may entirely consist of second coating material.

Here, the matrix 10 comprises thus interconnected luminescent nano particles 20. The matrix 10 comprises spherical-joint structures 50, wherein one or more spherical parts 51 comprise one or more coated luminescent nano particles 20. The spherical parts are interconnected with joints 52 comprising a material selected form the group consisting of $M1_x\text{-}M2_y\text{-}M3_z\text{-}A_{(x+2y+3z)/2}$, M4A and $SiO_2$ compounds, such as for instance ZnS or CdS or a combination thereof.

The distance between adjacent nano particles 20 within the matrix 10 is indicated with reference d. In general, this distance will be at least 5 nm. The thickness of the first coating layer 25 is indicated with reference d1; the thickness of the second coating 35 is indicated with reference d2. Reference L indicates the length of the above indicated joint 52. This length L of the joint 52 may for instance be in the range of 1-20 nm.

The term different in the context of the second coating material being different from the first, or the first coating material being different from the luminescent material, especially indicates that the chemical composition of such second coating material is different from the first coating material and the chemical composition of the first coating material is different from the composition of the luminescent material.

Figure 1B:
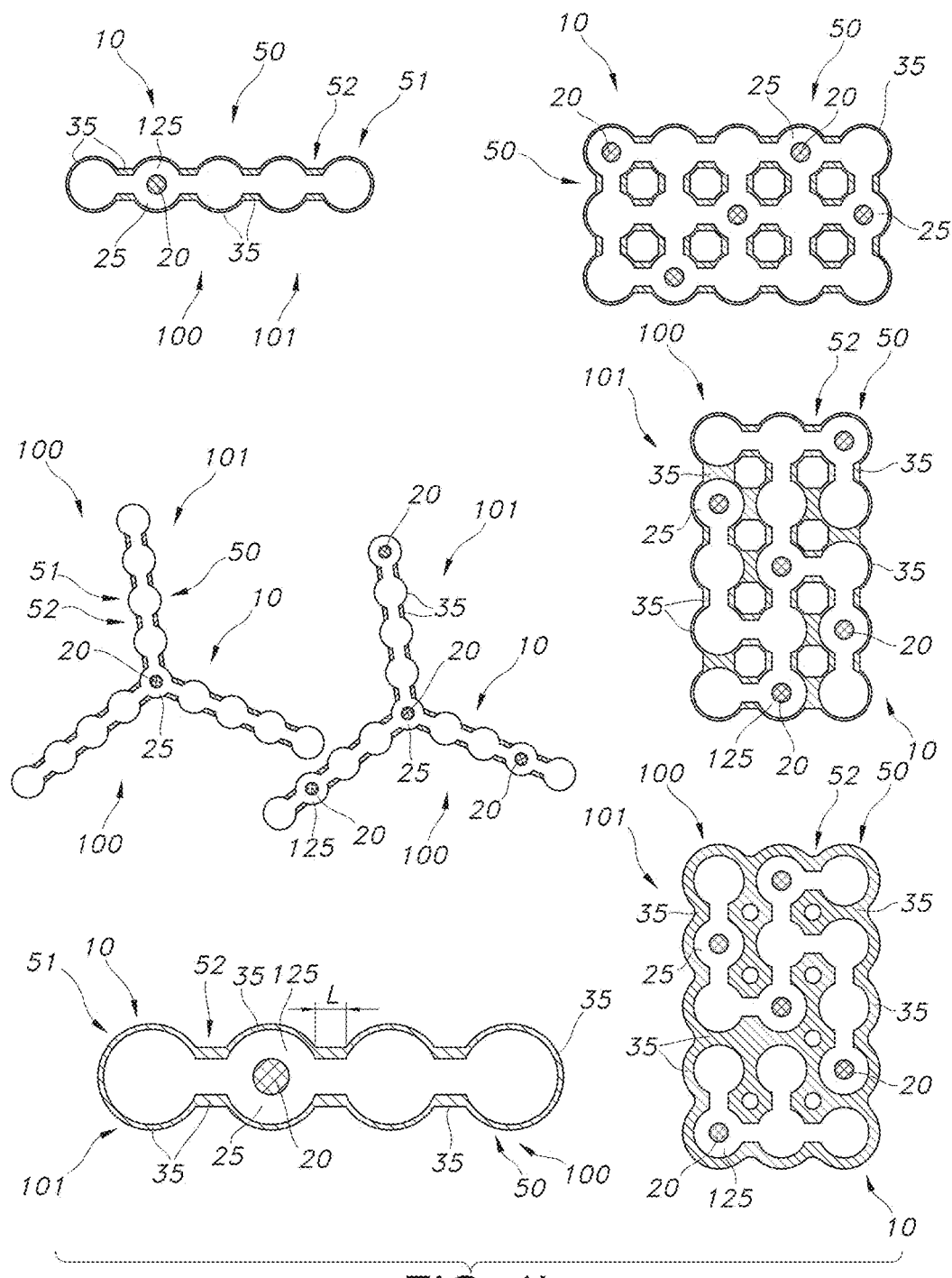

FIG. 1b schematically depicts a non-limiting number of possible types of luminescent material particles 101 of the luminescent nano particles based luminescent material 100 as described herein. Amongst others, tripods are schematically depicted. However, also matrices 10 are depicted wherein at least 50% of the (spheres 51 comprising) nano particles 20 are interconnected with at least two neighboring spheres 51, via joints 52.

Figure 1C:
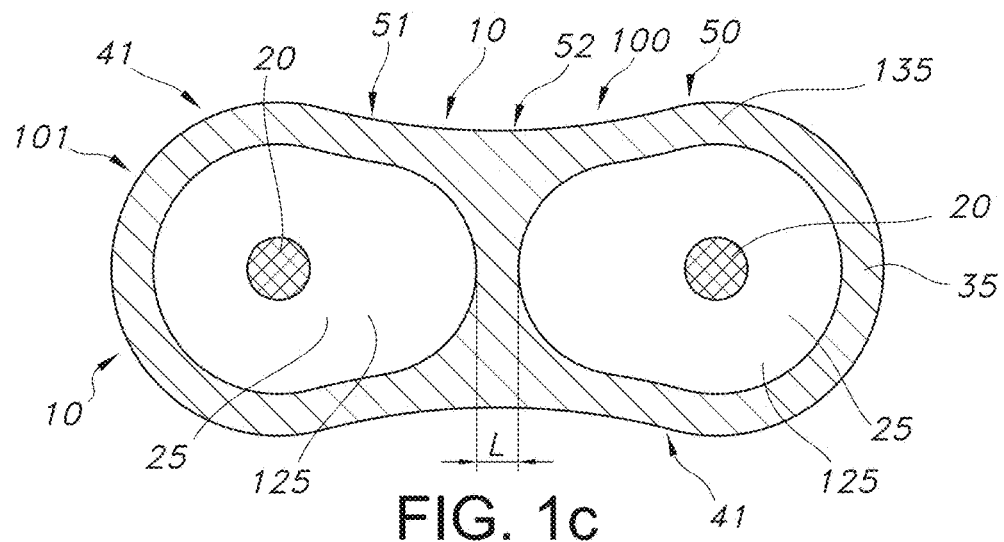

FIG. 1c schematically depicts an embodiment wherein the luminescent material 100 comprises luminescent material particles 101 which comprise dots-in-rods particles 41. The distance between the coated luminescent particles 20 is indicated with length L, wherein L is the distance between the coatings 25 of the adjacent luminescent material particles. Note that the coatings 25 are in this embodiment rod-shaped.

Figure 1D:
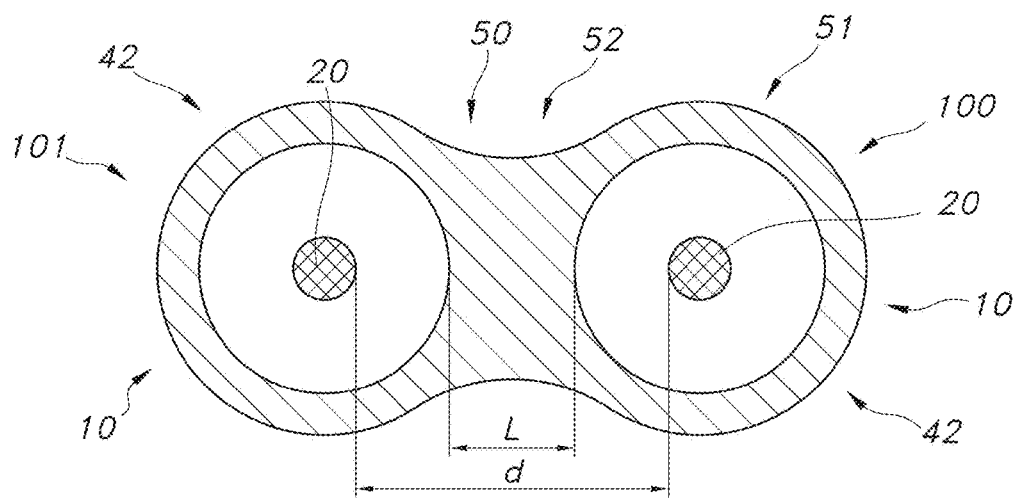

FIG. 1d schematically depicts an embodiment wherein the luminescent material 100 comprises luminescent material particles 101 which comprise core-shell particles 42.

The matrix 10 may also comprise a combination of both core-shell particles 42 and dots-in-rods particles 41.

Figure 2A:
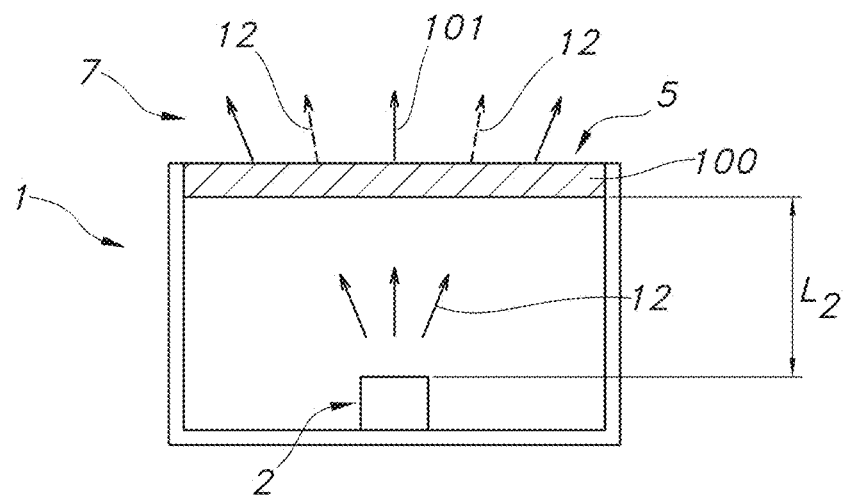
FIGS. 2a-2b schematically depicts an embodiment of the lighting unit. The drawings are not necessarily on scale.
Figure 2B:
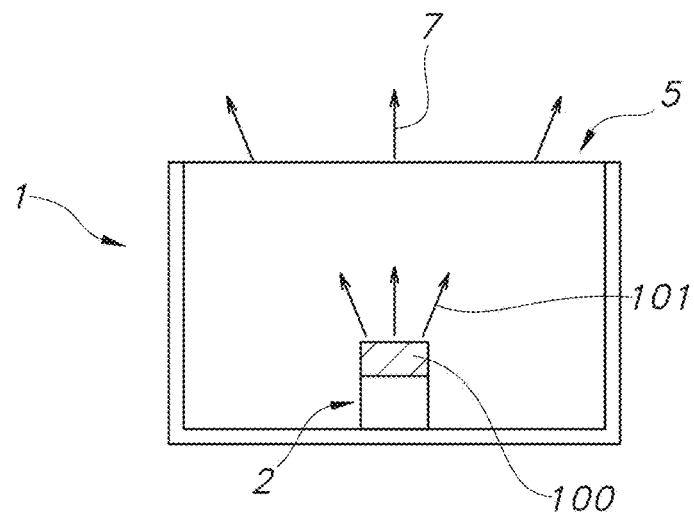

FIGS. 2a-2b schematically depict a non-limiting number of embodiments of a lighting unit 1 comprising a light source 2 configured to provide light source light 12 in the UV or blue part of the visible spectrum and the luminescent material 100 as described herein, configured to absorb at least part of the light source light 12. The luminescent nano particles based luminescent material 100 converts at least part of the light source light 12 into luminescent material light 101, and provides, optionally together with remaining light source light 12 lighting unit light 7. In FIG. 2a, an embodiment is depicted, wherein the luminescent nano particles based luminescent material 100 is comprises by an exit window 5 of the lighting unit. Dependent upon the type of light source 2, the type of luminescent nano particles based luminescent material 100, the amount and layer thickness of the luminescent nano particles based luminescent material 100, light source light 12 may be found downstream of the window 5, which is indicated with the dashed arrow. In FIG. 2a, the luminescent nano particles based luminescent material 100 is arranged at a non-zero distance from the light source 2. The distance is indicated with reference L2. In FIG. 2b, however, the distance L2 between the light source 2 and the luminescent material 100 is substantially zero. For instance, the luminescent nano particles based luminescent material 100 may be embedded in a resin on a LED light source.

The exit window 5 may for instance be an organic and/or inorganic matrix, wherein the luminescent nano particles based luminescent material 100 is embedded. Alternatively or additionally, the luminescent nano particles based luminescent material 100 of the invention may be coated to such window 5.

EXPERIMENTAL

Below we show an example experiment to obtain CdSe/CdS/ZnS nano composites with the described structure as well as the structure and optical characterization for the as-prepared material.

Example Experiment: CdSe/CdS/ZnS Nanocomposite Synthesis

CdSe/CdS dots-in-rods nanoparticles are prepared according to literature processes and dispersed in 1-octadecene (ODE) with the concentration of 5 microM. 2 ml of the above QRs solution, 0.1 mmol zinc diethyldithiolcarbamate and 0.05 mmol hexydecylamine are mixed into 10 ml ODE in a 100 ml flask under $N_2$. The mixture is heated slowly under stirring to 180° C. and kept for 10 min Then the solution is further heated to 240° C. and kept for 20 min. After synthesis, the solution is cooled down to room temperature and washed with ethanol and toluene for 2 times each. The washed particles are dispersed in 3 ml toluene and stored in closed bottle. The drop caste films of the particle are prepared by direct casting one drop of the particle solution on a glass plate and drying the drop in air.

Characterizations:

The structure and optical properties of the products could be easily detected. The structure could be characterized through the characterization methods of TEM, EDXS, XRD, ICPMS and XPS for the shape, type of components, crystal structure of components and ratio of the components. Here we used HRTEM to detect the structure, shape of the core-shell matrices.

Figure 3A:
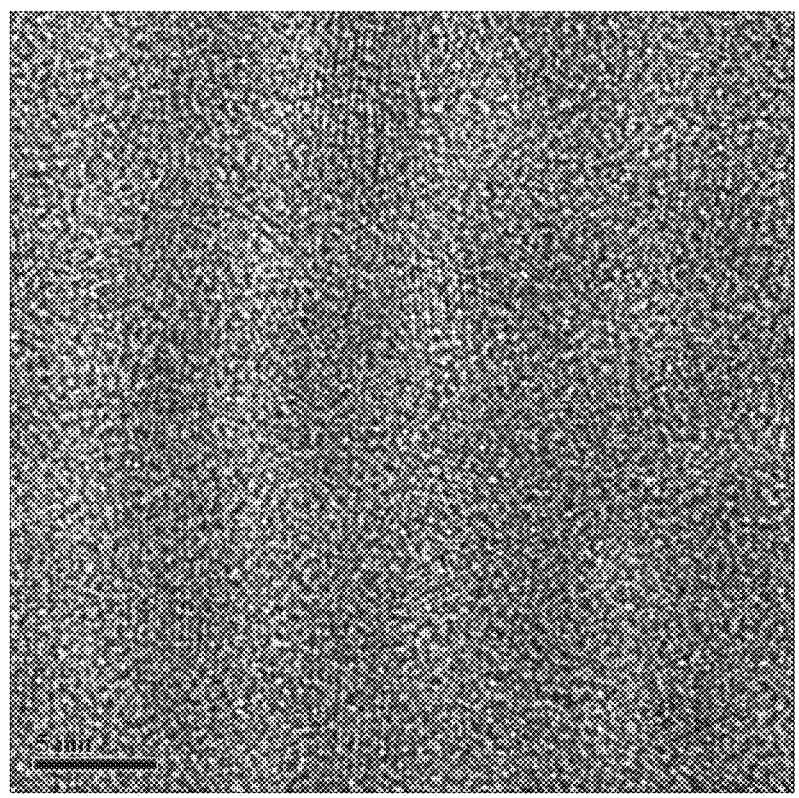
FIG. 3a displays a HRTEM image of nano-composite particles and FIG. 3b displays the same HRTEM image of nano-composite particles with black circles and and lines indicating the matrix of (here) CdSe/CdS with white lines indicating the ZnS coating.
Figure 3B:
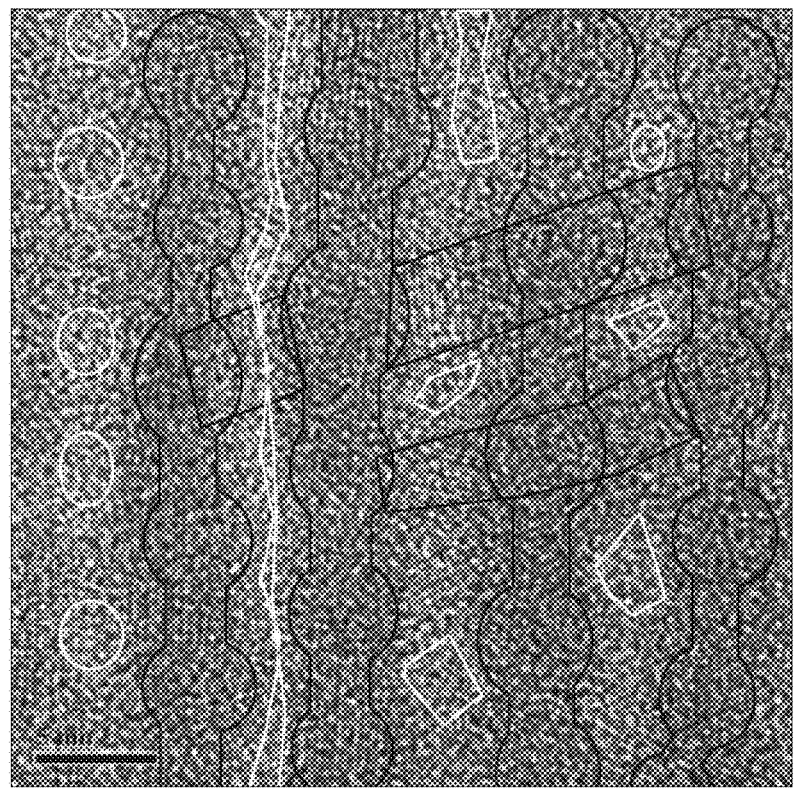

The image shown in FIGS. 3a-3b exhibits the lattice of the materials in different regions that give the evidence of the crystal structure of the components. FIG. 3a displays a HRTEM image of nano-composite particles and FIG. 3b displays the same HRTEM image of nano-composite particles with black circles and and lines indicating the matrix of (here) CdSe/CdS with the area within white lines and black lines indicating the ZnS coating.

Figure 4:
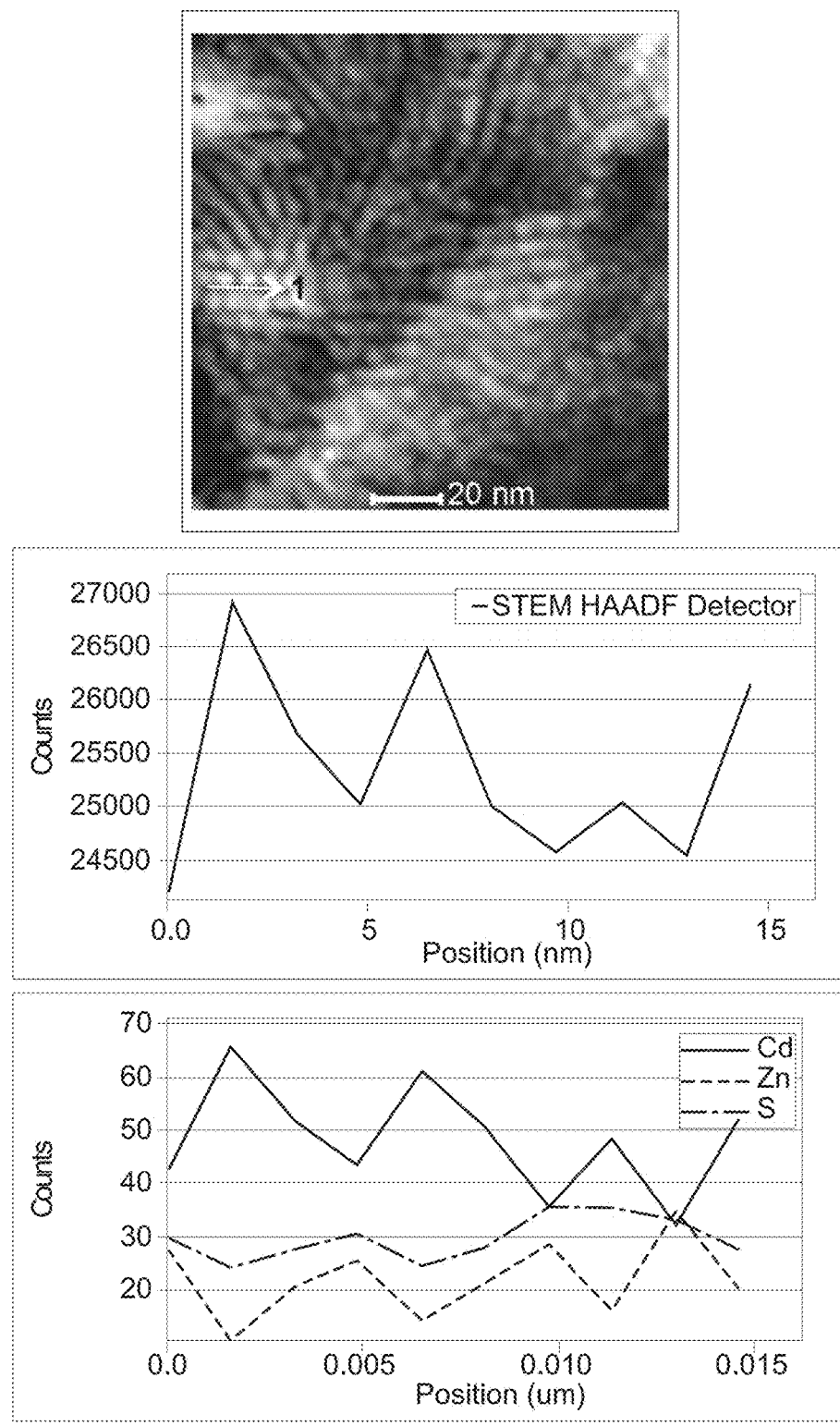
FIG. 4 displays the results of electron microscopy combined with EDXS.

FIG. 4 displays the results of electron microscopy combined with EDXS: the concentration of the components in different regions on surface and inside matrices can be seen. FIG. 4, the left images shows a detailed HAADF STEM image. The red arrow indicates the line that was scanned during EDX spectra acquisition: at equidistant points along this line EDX spectra were acquired. The arrow indicates the scan direction.

The upper right pane shows the intensity on the HAADF detector as a function of the position on the line. The lower right panes: EDX compositional profile. Along the vertical axis concentrations are given in mass %. Therefore when count in atomic concentration % the Zn has to be doubled because the molecule weight of Cd is near double of Zn. It is clearly visible in line scans that a higher intensity on the HAADF detector corresponds with a higher Cd and a lower Zn concentration. The special area chosen to make this scan is a group of the head of the CdSe/CdS rods which has the minimum Zn containing and may have some expose of CdS.

In the large scare TEM, you mainly see the CdSe/CdS particles because the ZnS has lower contrast than CdSe/CdS. However, in the high resolution TEM (HRTEM), you can clearly see the ZnS lattice among the CdSe/CdS that crosslink all the particles. The CdSe/CdS has the average distance of 4 nm and the ZnS thickness is larger than 1 nm.

The below table shows the XPS elements analysis of an CdSe/CdS/ZnS matrix:

| Sample | C 1s | Cd 3d | N 1s | O 1s | S2p | | Se 3d | Zn 3p |
|---|---|---|---|---|---|---|---|---|
| position (eV) | 284.8 | 404.5 | 399.5 | | 168.2 | 161.1 | | 88.5 |
| | org | | —NH | | —$SO_4$ | Sulphide | | |
| 144_A | 86 | 0.6 | 1.3 | 3.2 | 0.1 | 4.5 | <0.02 | 4.0 |
| 144_B | 88 | 0.4 | 1.3 | 2.9 | 0.1 | 3.9 | <0.02 | 3.7 |

The table shows the apparent atomic concentrations (at %) in the materials at the two duplicate positions. Results are shown in rows 3 and 4. In the second row peak positions in eV are given. The most likely chemical assignment, based on the peak position, is given in the third row. From this table we can draw the conclusion that the CdSe concentration is rather low due to the much lower volume of CdSe nuclei in the CdS/ZnS matrices. A present of —NH ligand on the surface of the particle and partly surface oxidization of the surface —S to —$SO_4$. Zn has a much higher concentration than Cd and Cd+Zn=S which indicates clearly amount of CdS and ZnS in the matrices. A minor part of the surface S stay as SO4-; it is common for CdS and ZnS QDs and will also stabilize the surface.

Figure 5:
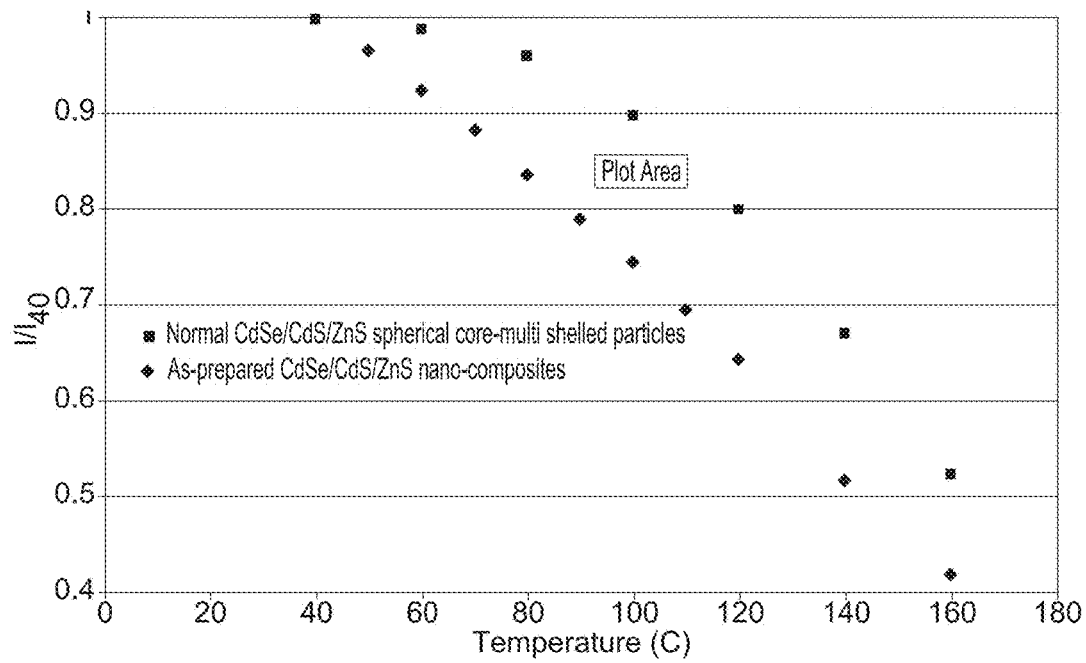
FIG. 5 shows the quantum yields temperature quenching for both drop caste normal CdSe/CdS/ZnS spherical dots and as-prepared CdSe/CdS/ZnS core-in-matrix composite.

The material was drop casted and studied the optical properties including quantum yields, thermal quenching and air stability/lifetime at 80° C. under the irradiation of a blue light at 450 nm with the power of 5 W/cm². The drop caste core-shelled CdSe/CdS quantum rods have the maximum quantum yields of 60% and show slightly red shift of 2-5 nm compare to the particle in solution. The shift is caused by concentration quenching. The reported CdSe/CdS/ZnS quantum rods and polymer composites have quantum yields of about 15-75% according to the literature (2-4). Our CdSe/CdS/ZnS composites with dots-in-matrix structure have much enhanced quantum yields with up to 90% with no/minor shift caused by concentration quenching. FIG. 5 shows the quantum yields temperature quenching for both drop caste normal CdSe/CdS/ZnS spherical dots and as-prepared CdSe/CdS/ZnS core-in-matrix composite. The results show the highly reduced thermal quenching of the composites. The diamonds indicate normal CdSe/CdS/ZnS spherical core multi-shelled particles and the square indicate as prepared CdSe/CdS/ZnS nano composites as described herein.

Figure 6:
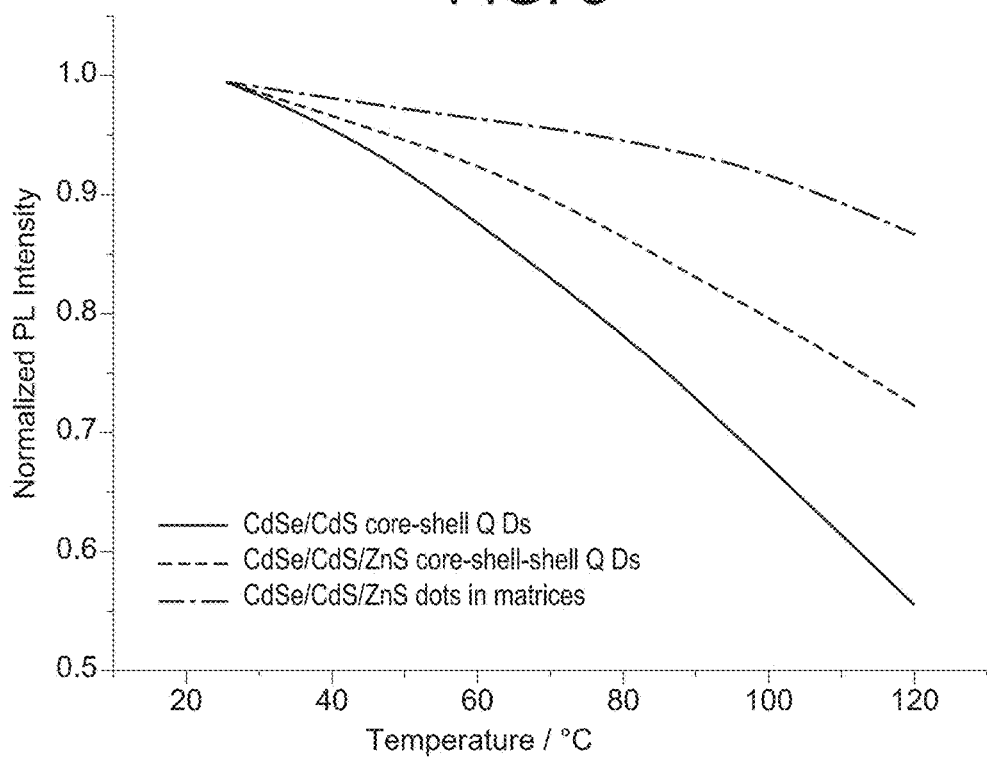
FIG. 6 shows a plot of the temperature depended photo luminescence intensity in air for CdSe/CdS quantum dots (lowest curve), CdSe/CdS/ZnS core-shell QDs (middle curve), and the CdSe/CdS/ZnS core-in-matrix composite as described herein (upper curve).

FIG. 6 shows a plot of the temperature depended photo luminescence intensity in air for CdSe/CdS quantum dots (lowest curve), CdSe/CdS/ZnS core-shell QDs (middle curve), and the CdSe/CdS/ZnS core-in-matrix composite as described herein (upper curve).

Figure 7:
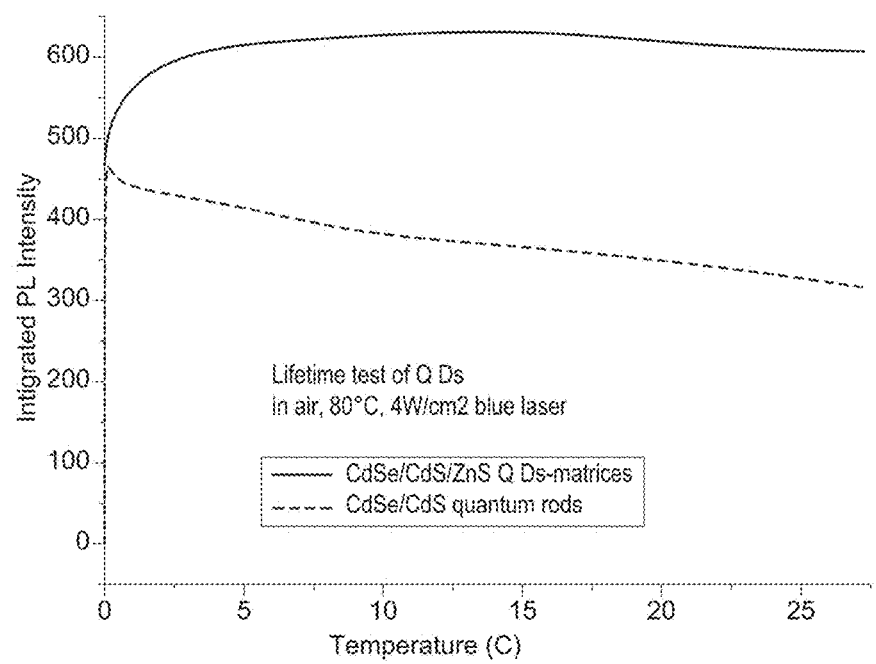
FIG. 7 shows a plot of the lifetime (temperature depended quantum efficiency) at 80° C. in air for both CdSe/CdS (lower curve) rods and the CdSe/CdS/ZnS core-in-matrix composite as described herein (upper curve).

FIG. 7 shows a plot of the lifetime (temperature depended quantum efficiency) at 80° C. in air for both CdSe/CdS (lower curve) rods and the CdSe/CdS/ZnS core-in-matrix composite as described herein (upper curve). Results show the highly improved stability of the composites.

These particles can be used as phosphors in LED lighting in various configurations such as remote, vicinity and proximity for converting blue light to other colours including white.

The herein presented ZnS matrices provide a thick layer of ZnS around the CdSe/CdS particles that confine the excitons within CdSe/CdS and stabilize them to reduce the thermal quenching and a distance among the CdSe cores that reduce the self-absorption and Forster energy transfer. Thin layer indicates less than 1.5 monolayer of the coating, meaning less than 0.5 nm of the shell thickness. Thick shelling is preferred because it will provide more unique properties as described above. The advantage of the proposed and presented structure, is not only the thickness of the ZnS layer—which is provided by the ZnS matrices, but also a homogenous ZnS shelling due to the unique spherical-joint structure. Only rod shape is not able to give such homogenous shelling. The total values of the ZnS could be analyzed and calculated by the element measurements such as XPS and ICPMS. In the case of the rods, an acceptable ZnS shelling should have the Zn:Cd ratio of >0.6; in the case of the present CdSe/CdS/ZnS matrices, the Zn:Cd ratio is larger than 2.

Herein, a QDs-in-matrix system is proposed, to obtain a stable core-multi shell structure, in which the first shell material (herein also indicated as first coating material (such as CdS) forms a matrix (with different surface facets in specified regions). During the shelling with the second shell material (herein also indicated as second coating material) (such as ZnS), facets of material (CdS) and (ZnS) which are matched grow in a semispherical fashion and become linked by more straight regions which have another crystallographic direction. The structure allows the stable and homogenous growth of different shells on the core materials and lead to highly enhanced performance of the nanoparticles.

Here we suggest a new QDs-in-matrix structure to achieve the desired properties and stability of the core-multi shell nanoparticles. Firstly, the core quantum dots (component A, for example CdSe) may be lattice matched grown into a matrix of one shell material (component B, for example CdS). This material (component B) shows a particular enhancement/function to the properties of core quantum dots. The whole matrices (A in B) are then coated with a second shell material (component C, for example ZnS) for further enhancement. During the shelling with the second shell material (component C), component C (for example ZnS) are lattice matched grown on facets of component B (for example CdS) in a semispherical fashion and linked by more straight regions which have another crystallographic direction. This structure leads to a reduced lattice stress between the component C and component B at the straight regions.

The invention claimed is:

1. A luminescent material comprising:
   luminescent nanoparticles;
   a first coating material coating the luminescent nanoparticles; and
   a second coating material coating the first coating material;
   wherein the luminescent nanoparticles, the first coating material, and the second coating material are different materials.

2. The luminescent material of claim 1 wherein the luminescent nanoparticles are interconnected in a matrix.

3. The luminescent material of claim 2 wherein the matrix is formed by the first coating material, which connects neighboring luminescent nanoparticles.

4. The luminescent material of claim 2 wherein the matrix is formed by the second coating material, which connects neighboring luminescent nanoparticles.

5. The luminescent material of claim 2 wherein neighboring luminescent nanoparticles in the matrix are spaced between 5 nm and 200 nm apart.

6. The luminescent material of claim 2 wherein the matrix comprises a spherical-joint structure, wherein the spheres comprise the luminescent nanoparticles.

7. The luminescent material of claim 1 wherein the luminescent nanoparticles are CdSe, the first coating material is CdS, and the second coating material is ZnS.

8. The luminescent material of claim 1 wherein the second coating has a thickness between 1 nm and 50 nm.

9. The luminescent material of claim 1 wherein
   the luminescent nanoparticles are selected from the group consisting of InP, CuInS$_2$, CuInSe$_2$, CdTe, CdSeTe, AgInS$_2$, AgInSe$_2$, and ZnSe:Mn;
   the first coating material is selected from the group consisting of $Cu_xZn_yIn_zS_{(x+2y+3z)/2}$, $Cu_xZn_yIn_zSe_{(x+2y+3z)/2}$, and ZnSeTe; and
   the second coating material is selected from the group consisting of SiO$_2$, MgS, ZnSe, ZnO, TiO$_2$, $Zn_{1-x}Mg_xS_ySe_{1-y}$, and ZnSO$_x$.

10. A device comprising:
    a light source; and
    a luminescent material disposed in a path of light emitted by the light source, the luminescent material comprising:
    luminescent nanoparticles;
    a first coating material coating the luminescent nanoparticles; and
    a second coating material coating the first coating material;
    wherein the luminescent nanoparticles, the first coating material, and the second coating material are different materials.

11. The device of claim 10 wherein the luminescent nanoparticles are interconnected in a matrix.

12. The device of claim 11 wherein the matrix is formed by the first coating material, which connects neighboring luminescent nanoparticles.

13. The device of claim 11 wherein the matrix is formed by the second coating material, which connects neighboring luminescent nanoparticles.

14. The device of claim 11 wherein neighboring luminescent nanoparticles in the matrix are spaced between 5 nm and 200 nm apart.

15. The device of claim 11 wherein the matrix comprises a spherical-joint structure, wherein the spheres comprise the luminescent nanoparticles.

16. The device of claim 10 wherein the luminescent nanoparticles are CdSe, the first coating material is CdS, and the second coating material is ZnS.

17. The device of claim 10 wherein the luminescent material is embedded in a resin and disposed in direct contact with the light source.

18. The device of claim 10 wherein the light source is disposed in a chamber and the luminescent material is disposed on an exit window of the chamber.

19. The device of claim 10 wherein the first coating material forms rods around dot shaped luminescent nanoparticles.

20. The device of claim 10 wherein:
    the luminescent nanoparticles are selected from the group consisting of InP, CuInS$_2$, CuInSe$_2$, CdTe, CdSeTe, AgInS$_2$, AgInSe$_2$, and ZnSe:Mn;
    the first coating material is selected from the group consisting of $Cu_xZn_yIn_zS_{(x+2y+3z)/2}$, $Cu_xZn_yIn_zSe_{(x+2y+3z)/2}$, and ZnSeTe; and
    the second coating material is selected from the group consisting of SiO$_2$, MgS, ZnSe, ZnO, TiO$_2$, $Zn_{1-x}Mg_xS_ySe_{1-y}$, and ZnSO$_x$.

* * * * *